United States Patent
Song

(10) Patent No.: US 11,937,445 B2
(45) Date of Patent: Mar. 19, 2024

(54) DISPLAY PANEL AND DISPLAY DEVICE

(71) Applicant: KunShan Go-Visionox Opto-Electronics Co., Ltd, Jiangsu (CN)

(72) Inventor: Yanqin Song, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 414 days.

(21) Appl. No.: 17/329,548

(22) Filed: May 25, 2021

(65) Prior Publication Data

US 2021/0280819 A1 Sep. 9, 2021

Related U.S. Application Data

(63) Continuation of application No. PCT/CN2019/118900, filed on Nov. 15, 2019.

(30) Foreign Application Priority Data

May 29, 2019 (CN) .......................... 201910458143.X

(51) Int. Cl.
H10K 50/842 (2023.01)

(52) U.S. Cl.
CPC ................ H10K 50/8426 (2023.02)

(58) Field of Classification Search
CPC .. H10K 50/8426; H10K 59/131; H10K 59/12; H10K 59/8722; H10K 59/871
See application file for complete search history.

(56) References Cited

U.S. PATENT DOCUMENTS

| 2012/0146041 A1 | 6/2012 | Han et al. |
| 2014/0183458 A1* | 7/2014 | Lee ..................... H10K 59/1213 438/46 |
| 2015/0001501 A1* | 1/2015 | Cho ........................ H10K 59/12 257/40 |

(Continued)

FOREIGN PATENT DOCUMENTS

| CN | 103915467 A | 7/2014 |
| CN | 104253241 A | 12/2014 |

(Continued)

OTHER PUBLICATIONS

International Search Report dated Feb. 28, 2020 in corresponding International Application No. PCT/CN2019/118900; 4 pages.

(Continued)

*Primary Examiner* — Jonathan Han
(74) *Attorney, Agent, or Firm* — Maier & Maier, PLLC

(57) ABSTRACT

A display panel and a display device, the display panel includes an encapsulation cover plate and a glass substrate, a light emitting unit and a driving circuit layer are arranged between the encapsulation cover plate and the glass substrate, a conductive layer and an encapsulation material layer are overlaid and arranged between the encapsulation region of the encapsulation cover plate and the glass substrate, the conductive layer is provided with a plurality of openings arranged at intervals, and an orthographic projection of the opening on the encapsulation material layer is separated from a midline between an inner edge and an outer edge of the encapsulation material layer.

20 Claims, 4 Drawing Sheets

(56) References Cited

U.S. PATENT DOCUMENTS

2015/0041772 A1* 2/2015 Han ..................... H10K 59/122
                                                            438/23

FOREIGN PATENT DOCUMENTS

| CN | 105576149 A | 5/2016 |
|----|-------------|--------|
| CN | 106299154 A | 1/2017 |
| CN | 107293565 A | 10/2017 |
| CN | 108321306 A | 7/2018 |
| CN | 108962941 A | 12/2018 |
| CN | 110085771 A | 8/2019 |

OTHER PUBLICATIONS

Office Action dated Nov. 29, 2019 in corresponding Chinese Application No. 201910458143.X; 7 pages.

* cited by examiner

DISPLAY PANEL AND DISPLAY DEVICE

CROSS-REFERENCE TO RELATED APPLICATIONS

This application is a continuation of International Application No. PCT/CN2019/118900, filed on Nov. 15, 2019, which claims priority to Chinese Patent Application No. 201910458143.X, filed on May 29, 2019, both of which are hereby incorporated by reference in their entireties.

TECHNICAL FIELD

The present application relates to the technical field of display technologies and, in particular, to a display panel and a display device.

BACKGROUND

Display screens have been widely used in many fields such as portable electronic devices (for example, they can be applied to mobile communication terminals, tablet computers, e-books and navigation devices) and large-screen electronic devices, where organic light-emitting diodes (abbreviated as OLED) are gradually being applied to display screens, since they have excellent properties of low power consumption, high color saturation, wide viewing angle, thin thickness and flexibility.

Nowadays, an OLED display includes an encapsulation cover plate and a glass substrate, where a functional film layer is arranged between the encapsulation cover plate and the glass substrate; the functional film layer specifically includes an organic light emitting layer, a thin film transistor (abbreviated as TFT) layer and a conductive film layer, where a frit encapsulation technique is often used between the encapsulation cover plate and the glass substrate, so that the glass substrate and an encapsulation region of the encapsulation cover plate are bonded together by a frit layer, where, in order to reduce a screen edge, a negative driving voltage (abbreviated as ELVSS) electrode wiring (an electrode wiring used to connect a cathode and an anode of the OLED with an external power supply) in the conductive layer is often arranged under the frit layer, in other words, an ELVSS electrode layer is arranged between the frit layer and the glass substrate.

However, when the ELVSS electrode layer is arranged between the frit layer and the glass substrate, during a reliability test of an OLED display screen, black spots are prone to appear on the OLED display screen, resulting in reduction of a qualification rate of the OLED display screen.

SUMMARY

The present application provides a display panel and a display device, which increases adhesion force between a glass substrate and an encapsulation cover plate, improving an encapsulation effect, and solving a problem of black spots being prone to appear on a display screen due to moisture easily entering into a display panel in existing display panels.

In order to achieve the above objectives, the present application provides a display panel, including: an encapsulation cover plate; a glass substrate; a light emitting unit, arranged between the encapsulation cover plate and the glass substrate; a driving circuit layer, arranged between the encapsulation cover plate and the glass substrate; an encapsulation material layer, arranged between the encapsulation region of the encapsulation cover plate and the glass substrate; a conductive layer, stacked with the encapsulation material layer and located between the encapsulation region of the encapsulation cover plate and the glass substrate; where, the conductive layer is provided with a plurality of openings arranged at intervals, and an orthographic projection of the opening on the encapsulation material layer is separated from a midline between an inner edge and an outer edge of the encapsulation material layer.

In this way, through the openings, the contact area of the encapsulation material layer and the glass substrate or the encapsulation cover plate is increased, so that the adhesion effect between the encapsulation material layer and the glass substrate or the encapsulation cover plate is greatly improved, moreover, the openings disposed on the conductive layer also increase the adhesion force between the conductive layer and the encapsulation material layer, which greatly improve the encapsulation effect, and render it difficult for moisture to enter into the display panel, in this case, an orthographic projection of the opening on the encapsulation material layer is separated from a midline between an inner edge and an outer edge of the encapsulation material layer, in this way, the openings disposed on the conductive layer and the midline between the inner edge and the outer edge of the encapsulation material layer are staggered in a vertical direction, so that the openings on the conductive layer avoid positions where bubbles are most likely to be generated in the encapsulation material layer, so that the bubbles generated in the encapsulation material layer will not enter into the openings, thereby avoiding a problem of moisture easily entering into the display panel, caused by a decrease in the adhesion force between the conductive layer and the encapsulation material layer due to accumulation of bubbles at the openings. Therefore, the display panel provided by the present application improves the encapsulation effect between the encapsulation cover plate and the glass substrate, so that the encapsulation effect of the display panel is good, and moisture cannot easily enter an interior of the display panel, thus avoiding a problem of black spots being prone to appear on a display screen caused by the entry of moisture in the display panel, thereby solving a problem of black spots being prone to appear on a display screen due to moisture easily entering into the display panel in existing display panels.

The present application further provides a display device, including the display panel according to any above.

DETAILED DESCRIPTION OF THE EMBODIMENTS

In order to make the purpose, technical solutions and advantages of the present application more explicit, the technical solutions in the embodiments of the present application will be described in detail below in conjunction with the accompanying drawings in the preferable embodiments of the present application. The described embodiments are some embodiments of the present application, not all of them. The following embodiments described with reference to the drawings are exemplary and only used to illustrate the present application, but cannot be interpreted as limitations to the present application. Based on the embodiments of the present application, all other embodiments obtained by those skilled in the art without creative works shall fall within the protection scope of the present application. Embodiments of the present application are described in detail below in conjunction with drawings.

Figure 1:
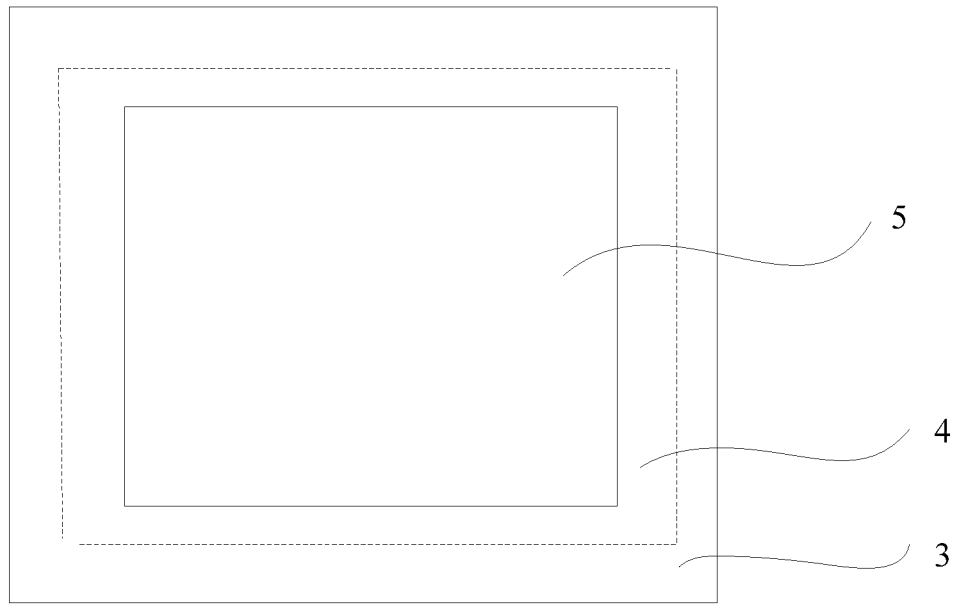
FIG. 1 is a schematic diagram of a top view structure between a frit layer and a conductive layer in a display panel.
Figure 2:
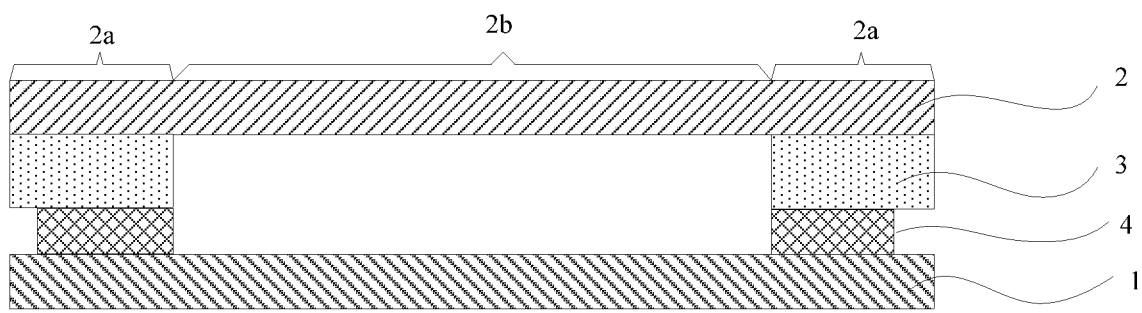
FIG. 2 is a schematic diagram of a cross-section structure of a display panel.

In an actual research process, a problem of black spots occurs easily during a reliability test of a display screen at present, and the reason is as follows. As shown in FIG. 1 and FIG. 2, in an OLED display screen, during encapsulation, a frit layer 3 is arranged between an encapsulation region 2*a* (an encapsulation cover plate 2 further includes a non-encapsulated region 2*b* corresponding to a display region 5) of an encapsulation cover plate 2 and a glass substrate 1, a laser is utilized to instantly burn the frit layer to melt, thereby bonding upper and lower substrates together, so that encapsulation of the OLED display panel is completed, achieving the purpose of isolating from water and oxygen.

However, in order to reduce a screen edge for increasing a screen-to-body ratio, as shown in FIG. 1 and FIG. 2, an ELVSS electrode wiring 4 is arranged under the frit layer 3, that is, a metal layer is arranged under the frit layer 3, and the ELVSS electrode wiring 4 is the entire metal layer, and the adhesion effect between the frit layer 3 and the metal layer is less than the adhesion effect between the frit layer 3 and the glass substrate 1, in this way, during a melting process of the frit layer, the adhesion force between the frit layer and the metal layer is reduced; in this case, when the frit layer is burned by laser to melt, it is easy for the frit layer to generate bubbles, and since the adhesion force between the frit layer and the metal layer is reduced, thus, the bubbles further reduce the adhesion force between the frit layer and the metal layer, finally, moisture can easily enter an interior of a display panel. When moisture enters the interior of the display panel, during a reliability test of an OLED display screen, due to presence of moisture in the display screen, black spots are prone to appear on the display region 5 of the display screen, in other words, in an existing display panel, since moisture easily enters into the display panel, black spots phenomenon are prone to appear on the OLED display, resulting in reduction of a qualification rate of the display screen.

Based on the above findings and existing technical problems, the embodiments of the present application provide following solutions: as shown in FIG. 3 to FIG. 10, an embodiment of the present application provides a display panel, the display panel includes an encapsulation cover plate 40 and a glass substrate 10, where the encapsulation cover plate 40 is specifically a cover plate made of glass materials. In the present embodiment, light emitting units and a driving circuit layer are arranged between the encapsulation cover plate 40 and the glass substrate 10.

Specifically, the light emitting units and the driving circuit layer are arranged on the glass substrate 10. In arrangement, firstly, the driving circuit layer can be arranged on the glass substrate 10, the driving circuit layer specifically includes a thin film transistor (abbreviated as TFT) layer and a metal layer (e.g., metal layers of scanning lines and data lines), and then the light emitting units are arranged on the driving circuit layer, where each light emitting unit includes an anode, a cathode and an organic light emitting layer located between the cathode and the anode, where, in order to facilitate the connection of the anode and cathode in the light emitting unit with an external power source, a conductive layer is often provided. Specifically, an encapsulation material layer 30 is arranged between the encapsulation region 41 of the encapsulation cover plate 40 and the glass substrate 10, a conductive layer 20 is stacked with the encapsulation material layer 30 and located between the encapsulation region 41 of the encapsulation cover plate 40 and the glass substrate 10, where, when the conductive layer 20 and the encapsulation material layer 30 are overlaid and arranged, an edge of the display screen can be reduced, so as to increase a screen-to-body ratio of the display screen.

In this case, since the conductive layer 20 is stacked with the encapsulation material layer 30, the stack order is not limited, so that the adhesion force between the encapsulation material layer 30 and the glass substrate 10 or between the encapsulation material layer 30 and the encapsulation cover plate 40 is reduced, a problem of encapsulation failure is prone to occur. In the present embodiment, in order to increase the adhesion force between the encapsulation material layer 30 and the glass substrate 10 or the encapsulation cover plate 40, specifically, the conductive layer 20 is provided with a plurality of openings 23 arranged at intervals, in this way, when the encapsulation material layer 30 is welded under action of a laser or dried under action of ultraviolet (abbreviated as UV) light, the encapsulation material layer 30 extends onto the glass substrate 10 or the encapsulation cover plate 40 through the openings 23, so as to increase the contact area between the encapsulation material layer 30 and the glass substrate 10 or the encapsulation cover plate 40, so that the adhesion effect between the encapsulation material layer 30 and the glass substrate 10 or the encapsulation cover plate 40 is greatly improved, moreover, the openings 23 disposed on the conductive layer 20 also increase the adhesion force between the conductive layer 20 and the encapsulation material layer 30, which greatly improve the encapsulation effect, and rendering it difficult for moisture to enter into the display panel.

Figure 3:
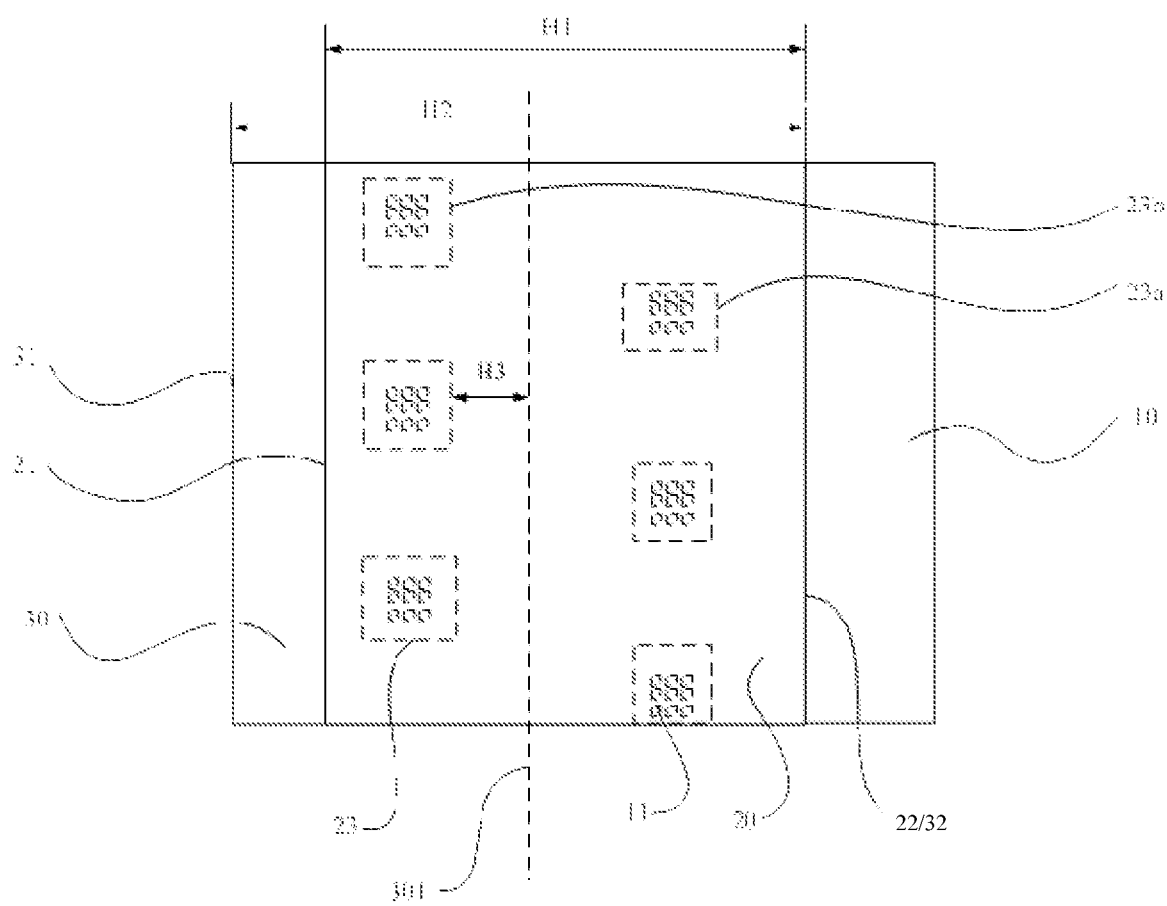
FIG. 3 is a schematic diagram of a top view structure of a part of an encapsulation material layer, a conductive layer and a glass substrate in a display panel provided by an embodiment of the present application.

Moreover, in the present embodiment, an orthographic projection of the opening 23 on the encapsulation material layer 30 is separated from a midline 301 between an inner edge and an outer edge (i.e., an outer edge 31 and an inner edge 32) of the encapsulation material layer 30, that is, in the present embodiment, the openings 23 disposed on the conductive layer 20 and the midline 301 (as shown in FIG. 3) between the inner edge and the outer edge of the encapsulation material layer 30 are staggered in a vertical direction, where a position of the midline 301 between the inner edge and the outer edge of the encapsulation material layer 30 is a middle position of the encapsulation material layer 30, the position has the strongest energy during a welding process of the laser-burnt encapsulation material layer 30, which is prone to generate bubbles.

However, in the present embodiment, when the openings 23 on the conductive layer 20 and the middle position (i.e., the position of the midline 301) of the encapsulation material layer 30 are staggered in the vertical direction, the openings 23 on the conductive layer 20 avoids the position where bubbles are most likely to be generated in the encapsulation material layer 30, so that bubbles generated in the encapsulation material layer 30 will not enter into the openings 23, thereby avoiding a problem of a decrease in the adhesion force between the conductive layer 20 and the encapsulation material layer 30 caused by accumulation of generated bubbles at the openings 23. Therefore, in the present embodiment, the openings 23 are disposed on the conductive layer 20, and the openings 23 and the midline 301 between the inner edge and the outer edge of the encapsulation material layer 30 are staggered in the vertical direction, so that the adhesion force between the conductive layer 20 and the encapsulation material layer 30 is significantly increased, the encapsulation effect between the encapsulation cover plate 40 and the glass substrate 10 is improved; compared with the related art, in the present embodiment, the encapsulation effect of the display panel is good, and moisture cannot easily enter an interior of the display panel, thus avoiding a problem of black spots being prone to appear on a display screen caused by the entry of moisture in the display panel.

In the present embodiment, when the openings 23 are disposed on the conductive layer 20, the openings 23 may be square openings as shown in FIG. 3, or in the present embodiment, the openings 23 may also be round holes or other irregularly shaped openings 23.

Figure 4:
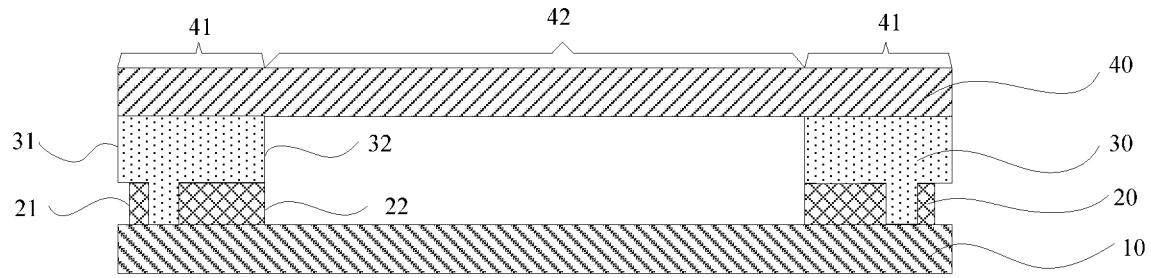
FIG. 4 is a schematic diagram of a cross-section structure of a display panel provided by an embodiment of the present application.
Figure 5:
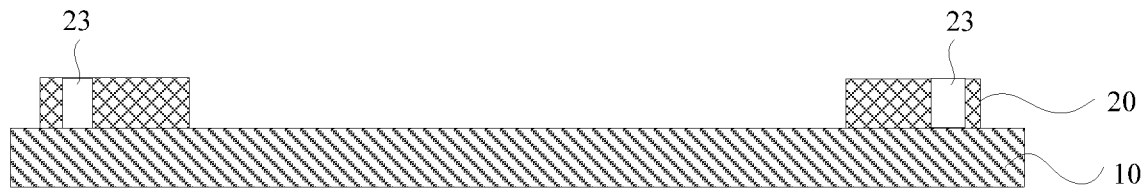
FIG. 5 is a schematic cross-sectional view of a glass substrate and a conductive layer in a display panel provided by an embodiment of the present application.

In the present embodiment, it should be noted that when the light emitting unit and the driving circuit layer are arranged between the encapsulation cover plate 40 and the glass substrate 10, the light emitting unit and the driving circuit layer are often arranged on a region of the glass substrate 10 corresponding to the display region. Specifically, as shown in FIG. 4, the encapsulation cover plate 40 includes a non-encapsulated region 42 corresponding to a display region and an encapsulation region 41 for encapsulation, since there is a need to provide the encapsulation material layer 30 and the conductive layer 20 at the encapsulation region 41, when the light emitting unit and the driving circuit layer are arranged between the encapsulation cover plate 40 and the glass substrate 10, the light emitting unit and the driving circuit layer will not be arranged at a position corresponding to the encapsulation region 41.

In the present embodiment, it should be noted that the conductive layer 20 can specifically be an ELVSS electrode layer, in other words, in the present embodiment, the ELVSS electrode layer is stacked with the encapsulation material layer 30 under the encapsulation region 41. In that case, in the present embodiment, the encapsulation material layer 30 can specifically be made of frit, in other words, frit encapsulation is adopted while encapsulating the encapsulation material layer 30. The encapsulation material layer 30 can also be a UV-curable adhesive (UV adhesive) encapsulation layer, in other words, UV encapsulation is adopted, where the frit encapsulation and the UV encapsulation are two existing encapsulation methods, and specific operating principles can refer to the existing ones. In the present embodiment, the operating principles of the frit encapsulation and the UV encapsulation will not be repeated herein.

In the present embodiment, it should be noted that since the glass substrate 10 and the encapsulation cover plate 40 often have square structures, the encapsulation region 41 of the encapsulation cover plate 40 is often disposed as an annular area, thus, when the conductive layer 20 and the encapsulation material layer 30 are arranged between the glass substrate 10 and the encapsulation region 41 of the encapsulation cover plate 40, both the conductive layer 20 and the encapsulation material layer 30 also have annular structures. The encapsulation material layer 30 has an outer edge 31 (i.e., an outer ring) and an inner edge 32 (i.e., an inner ring), a line connecting midpoints between the outer edge 31 and the inner edge 32 is the midline 301 (as shown in FIG. 3), the conductive layer 20 also has an outer edge 21 and an inner edge 22. In the present embodiment, an orthographic projection of the opening on the encapsulation material layer is separated from the midline between the outer edge 31 and the inner edge 32 of the encapsulation material layer 30 on the conductive layer 20 and the openings 23, in other words, the orthographic projection of the midline between the outer edge 31 and the inner edge 32 of the encapsulation material layer 30 on the conductive layer 20 is not located on the openings 23.

Therefore, the display panel provided by the present embodiment includes the encapsulation cover plate 40 and the glass substrate 10, the light emitting unit and the driving circuit layer are arranged between the encapsulation cover plate 40 and the glass substrate 10, where the conductive layer 20 and the encapsulation material layer 30 are overlaid and arranged between the encapsulation region 41 of the encapsulation cover plate 40 and the glass substrate 10, the conductive layer 20 is provided with the plurality of openings 23 arranged at intervals, in this way, through the openings 23, the contact area between the encapsulation material layer 30 and the glass substrate 10 or the encapsulation cover plate 40 is increased, so that the adhesion effect between the encapsulation material layer 30 and the glass substrate 10 or the encapsulation cover plate 40 is greatly improved.

Moreover, the openings 23 disposed on the conductive layer 20 also increase the adhesion force between the conductive layer 20 and the encapsulation material layer 30, which greatly improve the encapsulation effect, and render it difficult for moisture to enter into the display panel. In this case, the orthographic projection of the opening 23 on the encapsulation material layer 30 is separated from the midline 301 between the inner edge and the outer edge of the encapsulation material layer 30, in this way, the openings 23 disposed on the conductive layer 20 and the midline 301 between the inner edge and the outer edge of the encapsulation material layer 30 are staggered in the vertical direction, so that the openings 23 on the conductive layer 20 avoid positions in the encapsulation material layer 30 where bubbles are most likely to be generated, so that the bubbles generated in the encapsulation material layer 30 will not enter into the openings 23, thereby avoiding a problem of moisture easily entering into the display panel, caused by a decrease in the adhesion force between the conductive layer 20 and the encapsulation material layer 30 due to accumulation of bubbles at the openings 23.

Therefore, the display panel provided by the present embodiment improves encapsulation effect between the encapsulation cover plate 40 and the glass substrate 10 to obtain a good encapsulation effect of the display panel and avoid moisture entering into the display panel to cause black spots on a display screen.

Furthermore, on the basis of the above embodiment, in the present embodiment, as shown in FIG. 3, a minimum distance H3 between the orthographic projection of the opening 23 on the encapsulation material layer 30 and the midline 301 between the inner edge and the outer edge of the encapsulation material layer is greater than 50 µm, that is, in the present embodiment, the minimum distance H3 between the opening 23 and the midline 301 in a horizontal direction is greater than 50 µm. For example, the minimum distance H3 between the orthographic projection of the opening 23 on the encapsulation material layer 30 and the midline 301 may be 60 µm to keep the opening 23 on the conductive layer 20 away from the midline 301 on the encapsulation material layer 30, so as to ensure that the opening 23 on the conductive layer 20 is far away from a position where the energy of the encapsulation material layer 30 is maximum during a laser welding process and avoid a decrease in the adhesion force between the conductive layer 20 and the encapsulation material layer 30 caused by accumulation of generated bubbles at the openings 23.

Furthermore, on the basis of the above embodiment, in the present embodiment, orthographic projections of the plurality of openings 23 on the encapsulation material layer 30 are located on both sides of the midline 301, that is, in the present embodiment, the openings 23 on the conductive layer 20 are located on both sides of the midline 301 of the encapsulation material layer 30, respectively. For example, some openings 23 are arranged close to the outer edge 21 of the conductive layer 20, and the other openings 23 are arranged close to the inner edge 22 of the conductive layer 20. In the present embodiment, when the orthographic projections of the plurality of openings 23 on the encapsulation material layer 30 are located on both sides of the midline 301, the plurality of openings 23 are arranged on both sides of the midline 301 in at least one row at intervals along a direction of the midline 301, respectively. In the present embodiment, as shown in FIG. 3, orthographic projections of the plurality of openings 23 on the encapsulation material layer 30 are arranged in columns at intervals along the direction of the midline 301, respectively, so that two columns of the openings 23 are formed on the conductive layer 20, so that the openings 23 are arranged on the conductive layer 20 near both the inner edge and the outer edge, so as to ensure that uniform adhesion force exists between the conductive layer 20 and portions on both sides of the midline 301 of the encapsulation material layer 30.

Furthermore, on the basis of the above embodiment, in the present embodiment, the openings 23 which are located on both sides of the midline 301 are staggered along the midline 301. Specifically, as shown in FIG. 3, the openings 23a located on one side of the midline 301 and the openings 23b located on the other side of the midline 301 are staggered in the direction of the midline 301, and the openings are not arranged opposite to each other, in this way, when malfunction occurs, moisture will not continuously invade into the openings 23 and enter into the display panel; in other words, in the present embodiment, in a path from the outer edge 21 to the inner edge 22 of the conductive layer 20, instead of being arranged opposite to each other, the openings 23 which are located on both sides of the midline 301 are staggered, so as to ensure that the number of openings 23 in the path from the outer edge 21 to the inner edge 22 of the conductive layer 20 is reduced, therefore, a problem of moisture continuously invading into the openings 23 and entering into the display panel is avoided.

Furthermore, on the basis of the above embodiment, in the present embodiment, specifically, as shown in FIG. 4, the conductive layer 20 is arranged on a region of the glass substrate 10 corresponding to the encapsulation region 41, and the encapsulation material layer 30 is arranged between the encapsulation region 41 and the conductive layer 20, in other words, the conductive layer 20 is arranged under the encapsulation material layer 30. In this way, the encapsulation material layer 30 extends to a surface of the glass substrate 10 through the openings 23, so that the contact area of the encapsulation material layer 30 and the glass substrate 10 is increased, so as to increase the adhesion force between the encapsulation material layer 30 and the glass substrate 10, finally, the encapsulation effect between the encapsulation cover plate 40 and the glass substrate 10 is good, and moisture cannot easily enter an interior of the display panel.

Figure 6:
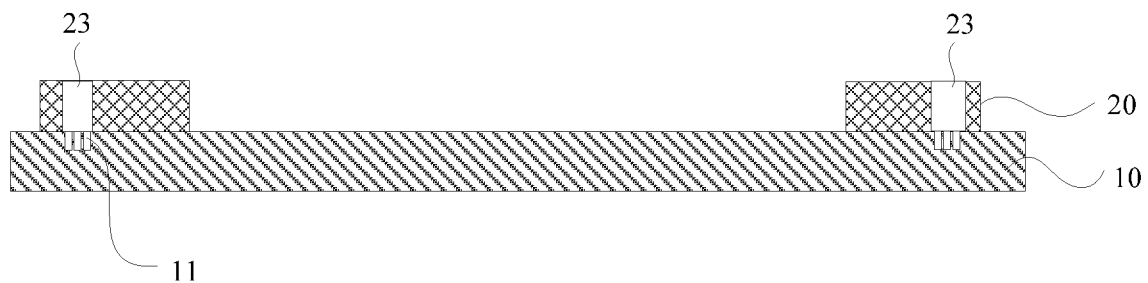
FIG. 6 is another schematic cross-sectional view of a glass substrate and a conductive layer in a display panel provided by an embodiment of the present application.
Figure 7:
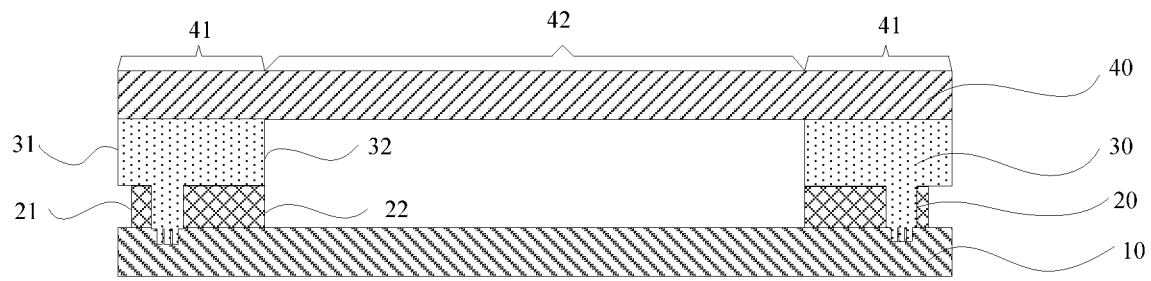
FIG. 7 is another schematic diagram of a cross-section structure of a display panel provided by an embodiment of the present application.

Furthermore, on the basis of the above embodiment, in the present embodiment, in order to further increase the adhesion force between the encapsulation material layer 30 and the glass substrate 10, specifically, as shown in FIG. 6 and FIG. 7, a plurality of first blind holes 11 are disposed on regions of the glass substrate 10 corresponding to the openings 23, and the encapsulation material layer 30 extends inside the glass substrate 10 through the openings 23 and the first blind holes 11; in other words, in the present embodiment, by arranging the plurality of first blind holes 11, the surface roughness of the regions on the glass substrate 10 corresponding to the openings 23 is increased, so that the adhesion force between the encapsulation material layer 30 and the glass substrate 10 is further increased, thereby achieving a better encapsulation effect.

Figure 8:
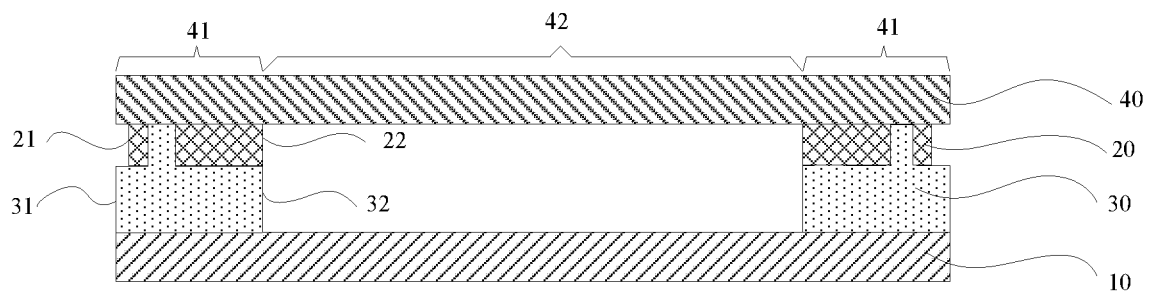
FIG. 8 is yet another schematic diagram of a cross-section structure of a display panel provided by an embodiment of the present application.

Furthermore, on the basis of the above embodiment, in the present embodiment, as shown in FIG. 8, the encapsulation material layer 30 can also be arranged on a region of the glass substrate 10 corresponding to the encapsulation region 41, and the conductive layer 20 is arranged between the encapsulation region 41 and the encapsulation material layer 30. In other words, the conductive layer 20 is arranged on the encapsulation material layer 30, in this way, the encapsulation material layer 30 extends to a surface of the encapsulation cover plate 40 through the openings 23 to increase the contact area of the encapsulation material layer 30 and the encapsulation cover plate 40, so as to increase the adhesion force between the encapsulation material layer 30 and the encapsulation cover plate 40 and achieve a good adhesion between the encapsulation material layer 30 and the glass substrate 10 during a welding process of the encapsulation material layer 30, thereby improving encapsulation effect between the encapsulation cover plate 40 and the glass substrate 10 and avoiding moisture entering into the display panel.

Figure 9:
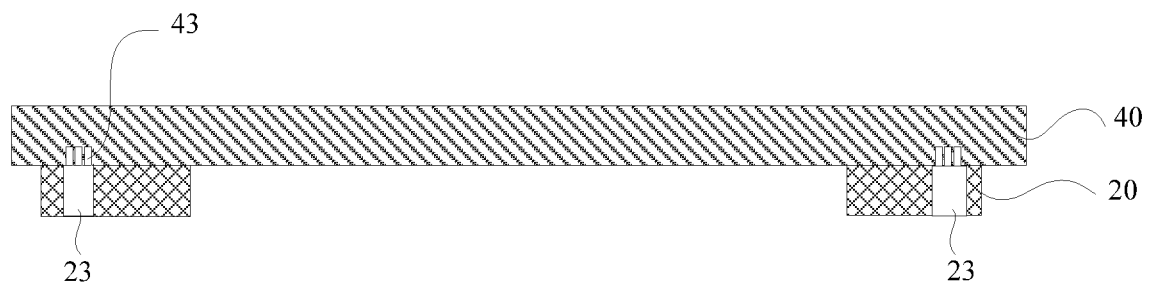
FIG. 9 is a schematic diagram of a cross-section structure of an encapsulation cover plate and a conductive layer in a display panel provided by an embodiment of the present application.
Figure 10:
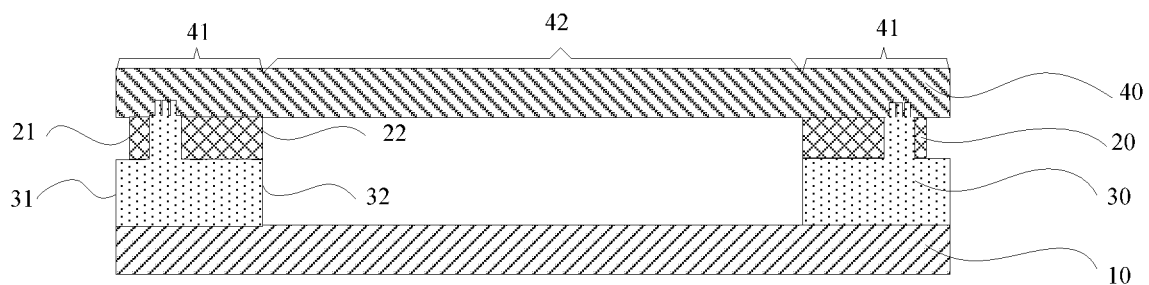
FIG. 10 is another schematic diagram of a cross-section structure of a display panel provided by an embodiment of the present application.

Furthermore, on the basis of the above embodiment, in the present embodiment, in order to further increase the adhesion force between the encapsulation material layer 30 and the encapsulation cover plate 40, as shown in FIG. 9 and FIG. 10, a plurality of second blind holes 43 are disposed on regions of the encapsulation cover plate 40 corresponding to the openings 23, and the encapsulation material layer 30 extends inside the encapsulation cover plate 40 through the openings 23 and the second blind holes 43; in other words, in the present embodiment, by arranging the plurality of second blind holes 43, the surface roughness of the regions on the encapsulation cover plate 40 corresponding to the openings 23 is increased, so that the contact area between the encapsulation material layer 30 and the encapsulation cover plate 40 is larger during a welding process, the adhesion force becomes stronger, the encapsulation effect between the encapsulation cover plate 40 and the glass substrate 10 would be better, and moisture cannot easily enter the interior of the display panel, thus avoiding a problem of black spots being prone to appear on a display screen during a test.

In that case, in the present embodiment, it should be noted that depths of the first blind holes 11 cannot exceed a thickness of the glass substrate 10, correspondingly, depths of the second blind holes 43 cannot exceed a thickness of the encapsulation cover plate 40; where, in the present embodiment, since some other functional film layers are often arranged on the glass substrate 10, such as an insulating layer, a buffer layer and other film layers, when the first blind holes 11 are disposed on the glass substrate 10, specifically, through holes are disposed on the film layer on the glass substrate 10, so that the contact area between the encapsulation material layer 30 and the film layer on the glass substrate 10 is increased, thereby increasing the adhesion force between the encapsulation material layer 30 and the glass substrate 10.

Furthermore, on the basis of the above embodiment, in the present embodiment, a distance between the inner edge and the outer edge of the conductive layer 20 is less than or equal to a distance between the inner edge and the outer edge of the encapsulation material layer 30, in other words, the width of the conductive layer 20 is less than or equal to the width of the encapsulation material layer 30. Specifically, in the present embodiment, as shown in FIG. 3, a distance H1 between the inner and the outer edges (the inner edge 22 and the outer edge 21) of the conductive layer 20 is less than a distance H2 between the inner and the outer edges (the inner edge 32 and the outer edge 31) of the encapsulation material layer 30, in this way, the contact area between the encapsulation material layer 30, and the encapsulation cover plate 40 and the glass substrate 10 becomes larger, the encapsulation effect becomes better, and the purpose of a narrow bezel of the display panel is achieved at the same time; in the present embodiment. In the case where the distance H1 between the inner and the outer edges of the conductive layer 20 is less than the distance H2 between the inner and the outer edges of the encapsulation material layer 30, when cutting the outer edge of the encapsulation material layer 30 after completing the encapsulation, it is not easy to cut the conductive layer 20 to avoid the waste of the conductive layer 20.

In that case, the display panel provided by the present embodiment can specifically be a flexible OLED display panel, thus the display panel can be bent.

An embodiment of the present application provides a display device, the display device can be an OLED display device and any product or component with a display function, such as a television, a digital camera, a mobile phone, a tablet computer, a smart watch, an e-book, and a navigation device, any of which includes an OLED display device.

In the present embodiment, the display device includes the display panel according to any of the above embodiments. In the present embodiment, for the structure, function, and implementation of the display panel, reference may be made to specific description in the above embodiments, which will not be repeated herein.

The display device provided by the present embodiment includes the above display panel, in this way, the contact area between the encapsulation material layer 30 and the glass substrate 10 or the encapsulation cover plate 40 is increased, so that the adhesion effect between the encapsulation material layer 30 and the glass substrate 10 or the encapsulation cover plate 40 is greatly improved, moreover, the openings 23 disposed on the conductive layer 20 also increase the adhesion force between the conductive layer 20 and the encapsulation material layer 30, which greatly improve the encapsulation effect, and render it difficult for moisture to enter into the display panel. In this case, the orthographic projection of the opening 23 on the encapsulation material layer 30 is separated from the midline 301 between the inner edge and the outer edge of the encapsulation material layer 30, in this way, the openings 23 disposed on the conductive layer 20 and the midline 301 between the inner edge and the outer edge of the encapsulation material layer 30 are staggered in the vertical direction, so that the openings 23 on the conductive layer 20 avoid positions where bubbles are most likely to be generated in the encapsulation material layer 30, so that the bubbles generated in the encapsulation material layer 30 will not enter into the openings 23, thereby avoiding a problem of moisture easily entering into the display panel, caused by a decrease in the adhesion force between the conductive layer 20 and the encapsulation material layer 30 due to accumulation of bubbles at the openings 23. Therefore, the display device provided by the present embodiment improves the encapsulation effect between the encapsulation cover plate 40 and the glass substrate 10 to obtain a good encapsulation effect of the display panel and avoid moisture entering into the display panel, avoiding black spots appearing on a display screen caused by the entry of moisture in the display panel.

Finally, it should be noted that the above embodiments are only used to illustrate the technical solutions of the present application, without limitation to the technical solutions. Although the present application has been described in detail with reference to the foregoing embodiments, those skilled in the art should understand: modifications to the technical solutions described in the foregoing embodiments, or equivalent substitutions of some or all of the technical features therein can still be made. However, these modifications or substitutions shall not make the essential of corresponding technical solutions depart from the scope of the technical solutions of the embodiments of the present application.

What is claimed is:

1. A display panel, comprising:
    an encapsulation cover plate having an encapsulation region;
    a glass substrate;
    a light emitting unit and a driving circuit layer arranged between the encapsulation cover plate and the glass substrate;
    an encapsulation material layer arranged between the encapsulation region of the encapsulation cover plate and the glass substrate, and
    a conductive layer stacked with the encapsulation material layer and located between the encapsulation region of the encapsulation cover plate and the glass substrate, wherein the conductive layer is provided with a plurality of openings arranged at intervals, a plurality of blind holes is disposed on regions of the glass substrate corresponding to the plurality of openings, and an orthographic projection of the opening on the encapsulation material layer is separated from a midline between an inner edge and an outer edge of the encapsulation material layer.

2. The display panel according to claim 1, wherein a minimum distance between the orthographic projection of the opening on the encapsulation material layer and the midline between the inner edge and the outer edge of the encapsulation material layer is greater than 50 μm.

3. The display panel according to claim 2, wherein orthographic projections of the plurality of openings on the encapsulation material layer are located on both sides of the midline, and the orthographic projections of the plurality of openings on the encapsulation material layer are arranged in at least one row at intervals along a direction of the midline, respectively.

4. The display panel according to claim 3, wherein the openings which are located on both sides of the midline are staggered along the midline.

5. The display panel according to claim 1, wherein the conductive layer is arranged on a region of the glass substrate corresponding to the encapsulation region, and the encapsulation material layer is arranged between the encapsulation cover plate and the conductive layer.

6. The display panel according to claim 5, wherein the encapsulation material layer extends inside the glass substrate through the openings and the plurality of blind holes.

7. The display panel according to claim 6, wherein depths of the plurality of blind holes are no more than a thickness of the glass substrate.

8. The display panel according to claim 1, wherein the encapsulation material layer is arranged on a region of the glass substrate corresponding to the encapsulation region, and the conductive layer is arranged between the encapsulation cover plate and the encapsulation material layer.

9. The display panel according to claim 1, wherein a distance between an inner edge and an outer edge of the conductive layer is less than or equal to a distance between the inner edge and the outer edge of the encapsulation material layer.

10. The display panel according to claim 1, wherein the encapsulation cover plate is made of glass material.

11. The display panel according to claim 1, wherein the conductive layer is a negative driving voltage electrode layer.

12. The display panel according to claim 1, wherein the encapsulation material layer is a film layer made of frit or an ultraviolet-curable adhesive encapsulation layer.

13. The display panel according to claim 1, wherein an orthographic projection of the inner edge of the encapsulation material layer on the glass substrate coincides with an orthographic projection of the inner edge of the conductive layer on the glass substrate.

14. A display panel, comprising:
an encapsulation cover plate having an encapsulation region;
a glass substrate;
a light emitting unit and a driving circuit layer arranged between the encapsulation cover plate and the glass substrate;
an encapsulation material layer arranged between the encapsulation region of the encapsulation cover plate and the glass substrate, and
a conductive layer stacked with the encapsulation material layer and located between the encapsulation region of the encapsulation cover plate and the glass substrate, wherein the conductive layer is provided with a plurality of openings arranged at intervals, a plurality of blind holes is disposed on regions of the encapsulation cover plate corresponding to the plurality of openings, and the encapsulation material layer extends inside the encapsulation cover plate through the openings and the plurality of blind holes.

15. The display panel according to claim 14, wherein depths of the plurality of blind holes are no more than a thickness of the encapsulation cover plate.

16. A display device, comprising
a display panel comprising an encapsulation cover plate having an encapsulation region;
a glass substrate;
a light emitting unit and a driving circuit layer arranged between the encapsulation cover plate and the glass substrate;
an encapsulation material layer arranged between the encapsulation region of the encapsulation cover plate and the glass substrate, and
a conductive layer stacked with the encapsulation material layer and located between the encapsulation region of the encapsulation cover plate and the glass substrate, wherein the conductive layer is provided with a plurality of openings arranged at intervals, a plurality of blind holes is disposed on regions of the glass substrate corresponding to the plurality of openings, and an orthographic projection of the opening on the encapsulation material layer is separated from a midline between an inner edge and an outer edge of the encapsulation material layer.

17. The display device according to claim 16, wherein a minimum distance between the orthographic projection of the opening on the encapsulation material layer and the midline between the inner edge and the outer edge of the encapsulation material layer is greater than 50 μm.

18. The display device according to claim 17, wherein orthographic projections of the plurality of openings on the encapsulation material layer are located on both sides of the midline, and the orthographic projections of the plurality of openings on the encapsulation material layer are arranged in at least one row at intervals along a direction of the midline, respectively.

19. The display device according to claim 18, wherein the openings which are located on both sides of the midline are staggered along the midline.

20. The display device according to claim 16, wherein the conductive layer is arranged on a region of the glass substrate corresponding to the encapsulation region, and the encapsulation material layer is arranged between the encapsulation cover plate and the conductive layer.

* * * * *